United States Patent
Liu et al.

(10) Patent No.: US 6,397,096 B1
(45) Date of Patent: May 28, 2002

(54) METHODS OF RENDERING VASCULAR MORPHOLOGY IN MRI WITH MULTIPLE CONTRAST ACQUISITION FOR BLACK-BLOOD ANGIOGRAPHY

(75) Inventors: Kecheng Liu, Solon; Paul M. Margosian, Lakewood; Jian Lin, Solon, all of OH (US)

(73) Assignee: Philips Medical Systems (Cleveland) Inc., Highland Heights, OH (US)

( * ) Notice: Subject to any disclaimer, the term of this patent is extended or adjusted under 35 U.S.C. 154(b) by 0 days.

(21) Appl. No.: 09/540,341

(22) Filed: Mar. 31, 2000

(51) Int. Cl.$^7$ .............................................. A61B 5/055

(52) U.S. Cl. ........................ 600/419; 382/130; 324/307; 324/309

(58) Field of Search ............................. 600/419, 420, 600/481; 324/306, 307, 309; 382/130; 128/653.1, 653.2, 653.3; 345/429, 432, 435

(56) References Cited

U.S. PATENT DOCUMENTS

| | | | |
|---|---|---|---|
| 4,748,409 A | 5/1988 | Frahm et al. | 324/309 |
| 4,881,033 A | 11/1989 | Denison et al. | 324/309 |
| 5,070,876 A | 12/1991 | Wright | 128/653.3 |
| 5,229,717 A | 7/1993 | Hinks | 324/309 |
| 5,257,626 A | 11/1993 | Pelc et al. | 128/653.2 |
| 5,271,399 A | 12/1993 | Listerud et al. | 324/309 |
| 5,273,040 A | 12/1993 | Apicella et al. | 128/653.2 |
| 5,329,925 A | * 7/1994 | NessAiver | |
| 5,422,576 A | * 6/1995 | Kao et al. | |
| 5,431,163 A | 7/1995 | Kajiyama | 128/653.2 |

(List continued on next page.)

FOREIGN PATENT DOCUMENTS

EP 0 296 834 A2 12/1988

OTHER PUBLICATIONS

U.S. application Ser. No. 08/688,714, Loncar et al., filed Jul. 31, 1996.

"Two–Contrast RARE: A Fast Spin–Density and T2–Weighted Imaging Method", Higuchi, et al., JMRI vol. 1, No. 2, p. 147.

"Rapid Spin Echo Imaging (RARE) Producing Two Effective Echo Times By Sharing Views", Fram, et al., pp. 218.

(List continued on next page.)

Primary Examiner—Brian L. Casler
(74) Attorney, Agent, or Firm—Fay, Sharpe, Fagan, Minnich & McKee, LLP

(57) ABSTRACT

A black blood magnetic resonance angiogram is produced by exciting dipoles (52) and repeatedly inverting the resonance ($54_1$, $54_2$, . . . ) to produce a series of magnetic resonance echoes ($56_1$, $56_2$, . . . ). Early echoes (e.g., ($56_1$, . . . , $56_8$)) are more heavily proton density weighted than later echoes (e.g., ($56_9$, . . . , $56_{16}$)), which are more heavily T2 weighted. The magnetic resonance echoes are received and demodulated (38) into a series of data lines. The data lines are sorted (60) between the more heavily proton density weighted data lines and T2 weighted data lines which are reconstructed into a proton density weighted image representation and a T2 weighted image representation. The proton density weighted and T2 weighted image representations are combined (90) to emphasize the black blood from the T2 weighted images and the static tissue from the proton density weighted image. The combination processor (90) scales (92) the PDW and T2W images to a common maximum intensity level. The PDW and T2W image representations are then combined, e.g. averaged, together (94) to form a combined or averaged image. An edge image (96) is computed from the T2W image and a threshold mask (98) is applied. The edge image (96) is combined (100) with the combined image (94) to form an edge enhanced image. Optionally, a minimum projection intensity algorithm (102) is applied to the enhanced image. Preferably, the enhanced image is a black blood magnetic resonance angiogram with emphasized blood vessel edges.

25 Claims, 4 Drawing Sheets

U.S. PATENT DOCUMENTS

| | | | |
|---|---|---|---|
| 5,447,155 A | | 9/1995 | NessAiver et al. ...... 128/653.2 |
| 5,528,144 A | | 6/1996 | Gullapalli et al. .......... 324/306 |
| 5,557,204 A | | 9/1996 | Lenz .......................... 324/309 |
| 5,590,654 A | * | 1/1997 | Prince |
| 5,594,336 A | | 1/1997 | Gullapalli et al. .......... 324/309 |
| 5,652,513 A | | 7/1997 | Liu et al. ..................... 324/306 |
| 5,672,970 A | | 9/1997 | Takai .......................... 324/309 |
| 5,786,693 A | | 7/1998 | Gullapalli et al. .......... 324/309 |
| 5,825,185 A | | 10/1998 | Liu et al. ..................... 324/309 |

OTHER PUBLICATIONS

"Comparing the FAISE Method With Conventional Dual–Echo Sequences", Melki, et al., JMRI 1991, 1:319–326.

Noll, "Variable–Averaging RARE", Magnetic Resonance in Medicine, v. 31, 1984 pp. 323–327.

Alexander, et al. "Partial Fourier Acquisition and Improved Interpolation of 3DFSE Black–Blood Images for Cerebral MRA".
Proceedings of ISMRM 6th Annual Meeting, Sydney, 1998, p. 795.

Liu, et al. "Sliding Interleaved Ky (SLINKY) Acquisition: A Novel 3D TOF Technique with Suppressed Slab Boundary Artifact".
JMRI vol. 8:905–911, 1998.

Cline, et al. "3D Reconstruction of the Brain From Magnetic Resonance Images Using a Connectivity Algorithm".
Magnetic Resonance Imaging vol. 5, pp. 345–352, 1987.

Rutt, et al. "Magnetic Resonance Techniques For Blood–Flow Measurement and Vascular Imaging".
Canadian Association of Radiologists Journal, v. 42, N. 1, Feb. 1991 pp21–30.

Liu, et al. "Artifact Transformation Technique: Shifted Interleaved Multi–Volume Acquisition (SIMVA) for 3D FSE".
Proceedings of ISMRM 6th Annual Meeting, Sydney, 1998, p. 572.

Oshio, et al. "T2–Weighted Thin–Section Imaging with the Multislab Three–Dimensional RARE Technique".
J. Mag. Reson. Imag. 1991; 1:695–700.

* cited by examiner

METHODS OF RENDERING VASCULAR MORPHOLOGY IN MRI WITH MULTIPLE CONTRAST ACQUISITION FOR BLACK-BLOOD ANGIOGRAPHY

BACKGROUND OF THE INVENTION

The present invention relates to the magnetic resonance imaging arts. It finds particular application in conjunction with black blood magnetic resonance angiography arid may be described with particular reference thereto. It is to be appreciated, however, that the invention will also find application in conjunction with other types of angiography and other types of magnetic resonance imaging.

Measurement of blood flow, in vivo, is important for the functional assessment of the circulatory system. Angiography has become a standard technique for making such functional assessments. Magnetic resonance angiography (MRA) provides detailed angiographic images of the body in a non-invasive manner, without the use of contrast agents or dyes.

Traditionally, MRA methods can be divided into "white blood" and "black blood" techniques. In white blood angiographs or time of flight (TOF) angiographs, magnetic resonance signal from flowing blood is optimized, while signal from stationary blood or tissue is suppressed. This method has been problematic for a number of reasons. First, it is difficult to generate accurate images of the vascular system because the excited blood is constantly moving out of the imaging region. Also, blood vessels often appear more narrow because signal from the slow-flowing blood at the edges of the vessels is difficult to detect. Signal is reduced by complex blood flow behavior, such as pulsatility, vorticity, and acceleration in tight turns, causing signal void due to dephasing.

In contrast, black blood angiography methods utilize a flow-related signal void. The magnetic resonance signals from flowing blood are suppressed, while the signals from stationary blood and tissue are optimized. In other words, flowing blood is made to appear dark or black on the magnetic resonance image due to an absence or minimum of resonance signal emanating from the blood. The black blood method is typically preferable to the white blood method because it is easier to make flowing blood appear dark for the aforementioned reasons. In addition, blood vessels on a black blood angiograph appear larger because the slow-moving blood at the edges is clearly imaged. Also, the black blood MRA provides more detailed depiction of small vessels where blood flow is slower.

In black blood MRA, the flow-related signal void can be generated by using spoiling gradients, pre-saturation RF pulses, or defocused flowing spins. The first two means are mostly used in field echo (FE) style sequences while the latter one is typically used in spin echo (SE) style sequences, such as fast spin echo (FSE) sequences.

In the past, proton density weighted (PDW) FSE sequences have been used to acquire black blood angiography images. For an n-echo FSE sequence (n=2, 4, . . . , 32, etc.) the first echo is oriented near the center of k-space, the second echo is located in the adjacent segment, and so on working out from the center.

In such an arrangement of k-space data, PDW images are acquired. These images typically exhibit good background tissue depiction. However, slow-flowing dipoles are refocused by the subsequent 180° pulses contributing signal and resulting in "filling", i.e., black blood in the center of arteries and veins and white or gray blood along the blood vessel walls, in capillaries, and in areas with slower moving blood. The filling effect leads to falsified vessel definition. While this problem may be resolved by using pre-saturation RF pulses, this comes at the cost of increasing patient magnetic field dose (SAR) which is very critical on a high field system ($\geq 1.5$ T).

Typically, black blood angiography images are processed using conventional minimum intensity projection algorithms. However, because minimum intensity projection algorithms enhance dark areas of signal void, it is difficult to distinguish dark vascular regions from dark background and/or cavities. In the past, the difficulty in distinguishing vascular and nonvascular dark regions has been resolved by using manually defined seed voxels, either vascular or nonvascular, as a starting point. From there, thresholding and connectivity criteria have been employed to selectively locate vascular signal voids. This image processing method is both slow and complicated, thus reducing ease and efficiency of black blood MRA applications. In addition, previous methods have not attempted to use two types of measurement, containing supplementary and complementary data, with different types of contrast.

The present invention contemplates a new method and apparatus which overcome the above-referenced problems and others.

SUMMARY OF THE INVENTION

In accordance with one aspect of the present invention, a method for generating a black blood magnetic resonance angiograph of a body portion includes exciting dipoles within a selected imaging region to produce magnetic resonance signals. A train of magnetic resonance echoes are induced after the excitation such that early echoes of the train are more heavily proton density weighted and later echoes are more heavily T2 weighted. The train of magnetic resonance echoes are phase and frequency encoded and received and demodulated into a series of data lines. The data lines are sorted between data lines from more heavily proton density weighted echoes and data lines from more heavily T2 weighted echoes. The more heavily proton density weighted data lines are reconstructed into a proton density weighted image representation, while the more heavily T2 weighted data lines are reconstructed into a T2 weighted image representation. The proton density weighted and T2 weighted image representations are combined to generated a combined image representation.

In accordance with a more limited aspect of the present invention, the combining step includes scaling the proton density weighted image representation and the T2 weighted image representation to a common maximum intensity level. The proton density weighted and T2 weighted image representations are averaged to form an averaged image representation. An edge enhanced image is computed from the T2 weighted image representation and the edge image representation is subtracted from the averaged image representation, forming an angiographic image representation.

In accordance with another aspect of the present invention, a magnetic resonance imaging system includes a magnet for generating a temporally constant magnetic field through an examination region. A radio frequency transmitter excites and inverts magnetic dipoles in the examination region to generate a train of magnetic resonance echoes. Gradient magnetic field coils and a gradient magnetic field controller generate at least phase and read magnetic field gradient pulses in orthogonal directions across the examination region. A receiver receives and demodulates the magnetic resonance echoes to produce a series of data lines. A sort processor sorts the data lines between proton density weighted data lines and T2 weighted data lines. An early echo volume memory stores proton density weighted data lines, while a late echo volume memory stores the T2 weighted data lines. An image processor reconstructs the proton density weighted data lines into a proton density weighted image representation and the T2 weighted data lines into a T2 weighted image representation. A combination processor combines the proton density weighted and T2 weighted image representations.

In accordance with a more limited aspect of the present invention, the combination processor includes a scaling processor which scales the proton density weighted and T2 weighted image representations to a common maximum intensity level. A processor combines the proton density weighted and T2 weighted image representations into a combined image representation. An edge image processor computes an edge image representation from the T2 weighted image representation. A processor combines the edge image representation and the combined image representation to form an edge enhanced image representation.

In accordance with another aspect of the present invention, a method for combining at least a first and second complex image representation having different preferential attributes is provided. The method includes scaling the first and second complex image representations to a common maximum intensity level. The first and second complex image representations are combined to form a combined image. A gradient image is calculated by differentiating at least one of the first and second complex image representations in order to enhance desired image features present in the at least one of the first and second image representations. Combining the gradient image with the combined image forms a desired feature enhanced image having enhanced supplementary and redundant information relative to the first and second complex image representations.

One advantage of the present-invention is that it is more scan time efficient.

Another advantage of the present invention is that it results in improved signal-to-noise ratio.

Another advantage of the present invention is that multiple contrast images, such as a proton density weighted image, a T2 weighted image, and a black blood angiogram, are acquired from a single scan.

Another advantage of the present invention is that it leads to more accurate vascular morphology and better depiction of hyperfine vessels.

Another advantage of the present invention is that it eliminates mis-registration error between proton density weighted images and T2 weighted images.

Yet another advantage of the present invention is that it reduces the SAR level.

Still further advantages and benefits of the present invention will become apparent to those of ordinary skill in the art upon reading and understanding the following detailed description of the preferred embodiments.

BRIEF DESCRIPTION OF THE DRAWING

The invention may take form in various components and arrangements of components, and in various steps and arrangements of steps. The drawings are only for purposes of illustrating preferred embodiments and are not to be construed as limiting the invention.

DETAILED DESCRIPTION OF THE PREFERRED EMBODIMENTS

Figure 1A:
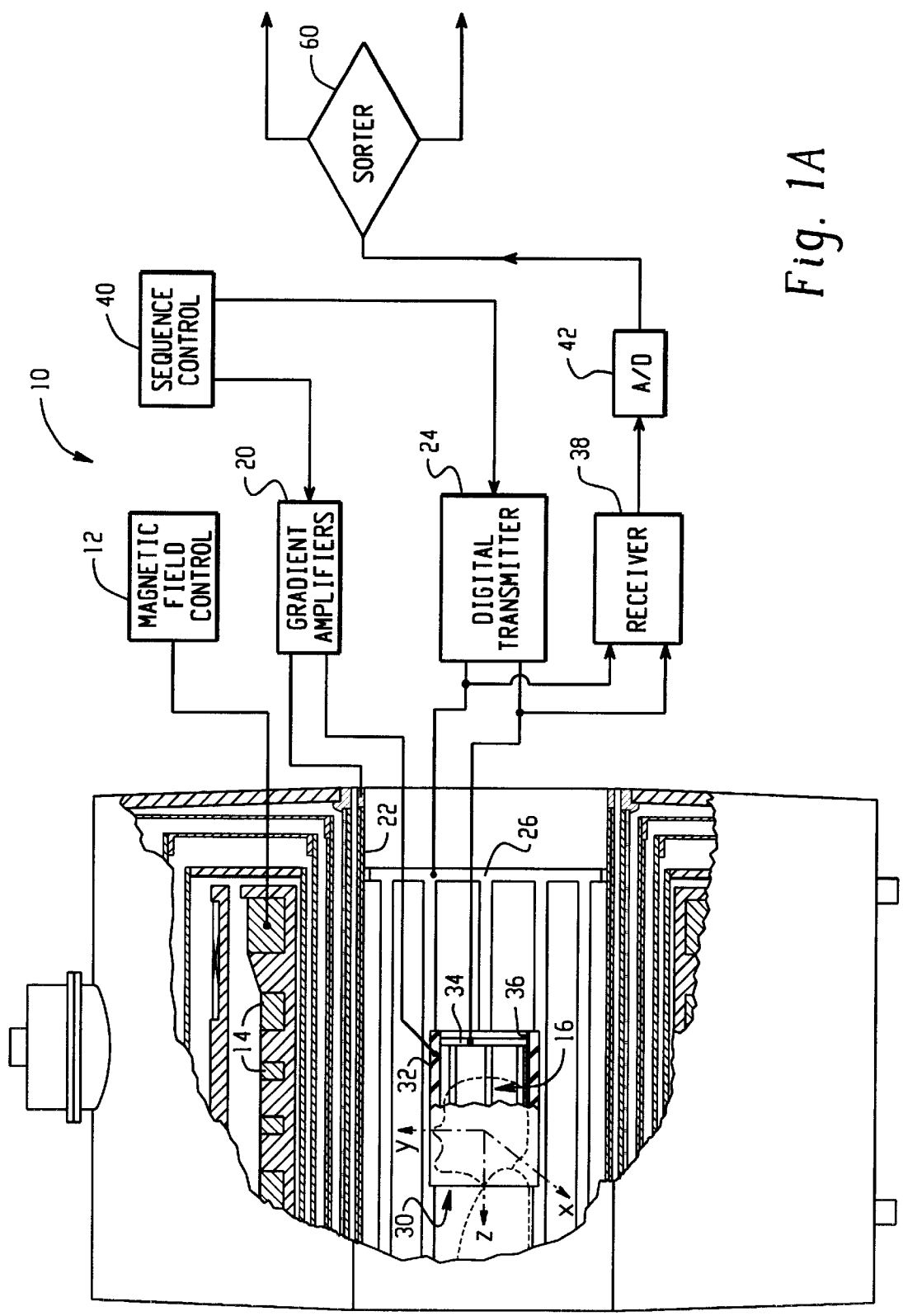
FIGS. 1A and 1E taken together are a diagrammatic illustration of a magnetic resonance imaging system in accordance with the present invention.
Figure 1B:
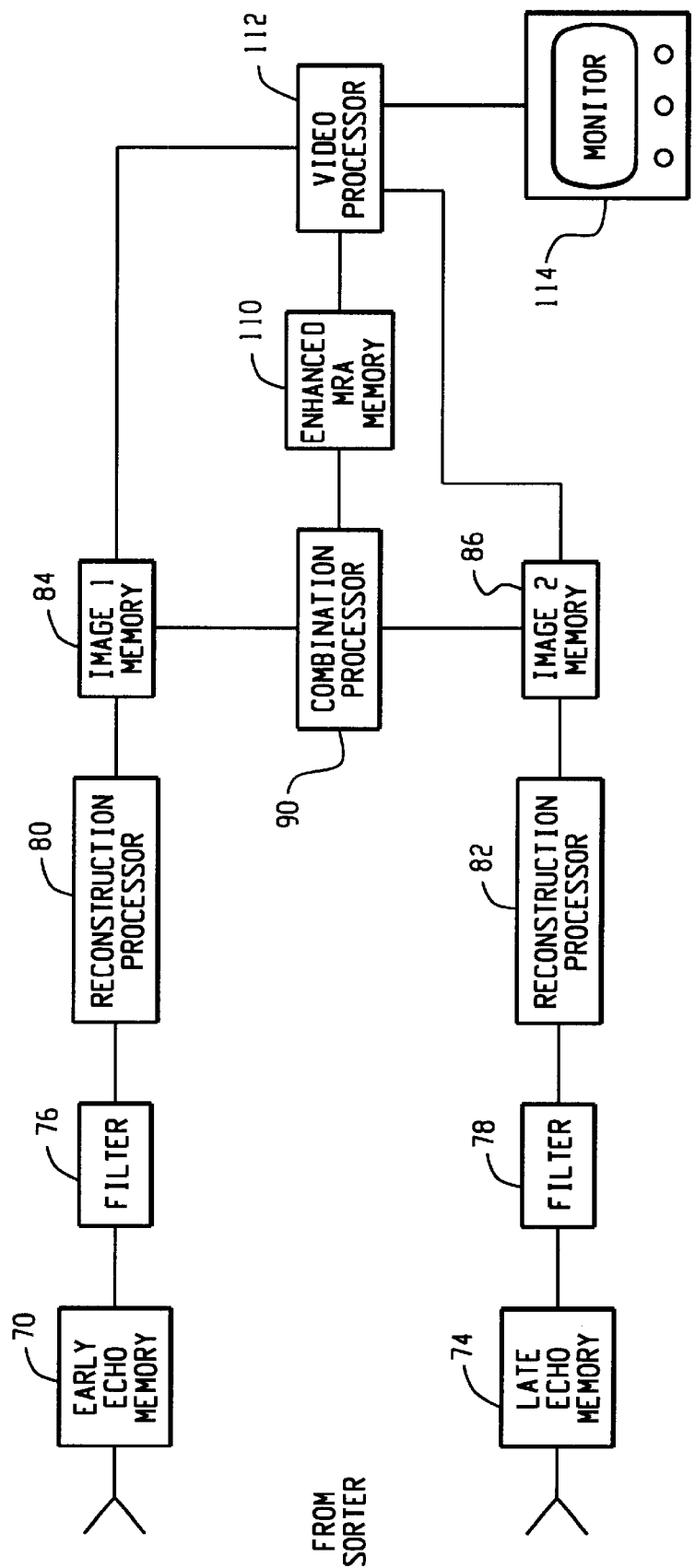

With reference to FIGS. 1A and 1B, a magnetic resonance imaging system 10 includes a main magnetic field control 12 which controls superconducting or resistive magnets 14 such that a substantially uniform, temporally constant main magnetic field is created along a z-axis through an examination region 16. Although a bore-type magnet is illustrated in FIG. 1, it is to be appreciated that the present invention is equally applicable to open magnet systems. A magnetic resonance echo means applies a series of radio frequency (RF) and magnetic field gradient pulses to invert or excite magnetic spins, induce magnetic resonance, refocus magnetic resonance, manipulate magnetic resonance, spatially and otherwise encode the magnetic resonance, to saturate spins, and the like to generate magnetic resonance imaging and spectroscopy sequences.

More specifically, gradient pulse amplifiers 20 apply current pulses to selected ones or pairs of whole-body gradient coils 22 to create magnetic field gradients along x, y, and z-axes of the examination region 16. A digital radio frequency transmitter 24 transmits radio frequency pulses or pulse packets to a whole-body quadrature RF coil 26 to transmit RF pulses into the examination region. A typical radio frequency pulse is composed of a packet of immediately contiguous pulse segments of short duration which, taken together with each other and any applied gradients, achieve a selected magnetic resonance manipulation. The RF pulses are used to saturate, excite resonance, invert magnetization, refocus resonance, or manipulate resonance in selected portions of the examination region. For whole-body applications, the resonance signals are commonly picked up in quadrature by the whole body RF coil 26.

For generating images of limited regions of the subject, local coils are commonly placed contiguous to the selected region. For example, an insertable head coil 30 is inserted surrounding a selected brain region at the isocenter of the bore. The insertable head coil preferably includes local gradient coils 32 which receive current pulses from the gradient amplifiers 20 to create magnetic field gradients along x, y, and z-axes in the examination region within the head coil. A local quadrature radio frequency coil 34 is used to excite magnetic resonance and receive magnetic resonance signals emanating from the patient's head. Alternatively, a receive-only local radio frequency coil can be used for reception of resonance signals introduced by body coil RF transmissions. An RF screen 36 screens the RF signals from the RF head coil from inducing any currents in the gradient coils and the surrounding structures. The resultant radio frequency signals, whether picked up in quadrature by the whole-body RF coil 26, the local RF coil 34, or other specialized RF coils, are demodulated by a receiver 38, preferably a digital receiver.

A sequence control processor 40 controls the gradient pulse amplifiers 20 and the transmitter 24 to generate any of a plurality of magnetic resonance imaging and spectroscopy sequences, such as fast spin echo imaging, and other conventional sequences. For the selected sequence, the receiver 38 receives a plurality of data lines from a rapid succession of echoes following each RF excitation pulse. An analog-to-digital converter 42 converts each of the data lines to a digital format. The analog-to-digital converter 42 is disposed between the radio frequency receiving coil and the receiver 38 for digital receivers and is disposed down stream (as illustrated) from the receiver for analog receivers.

Figure 2:
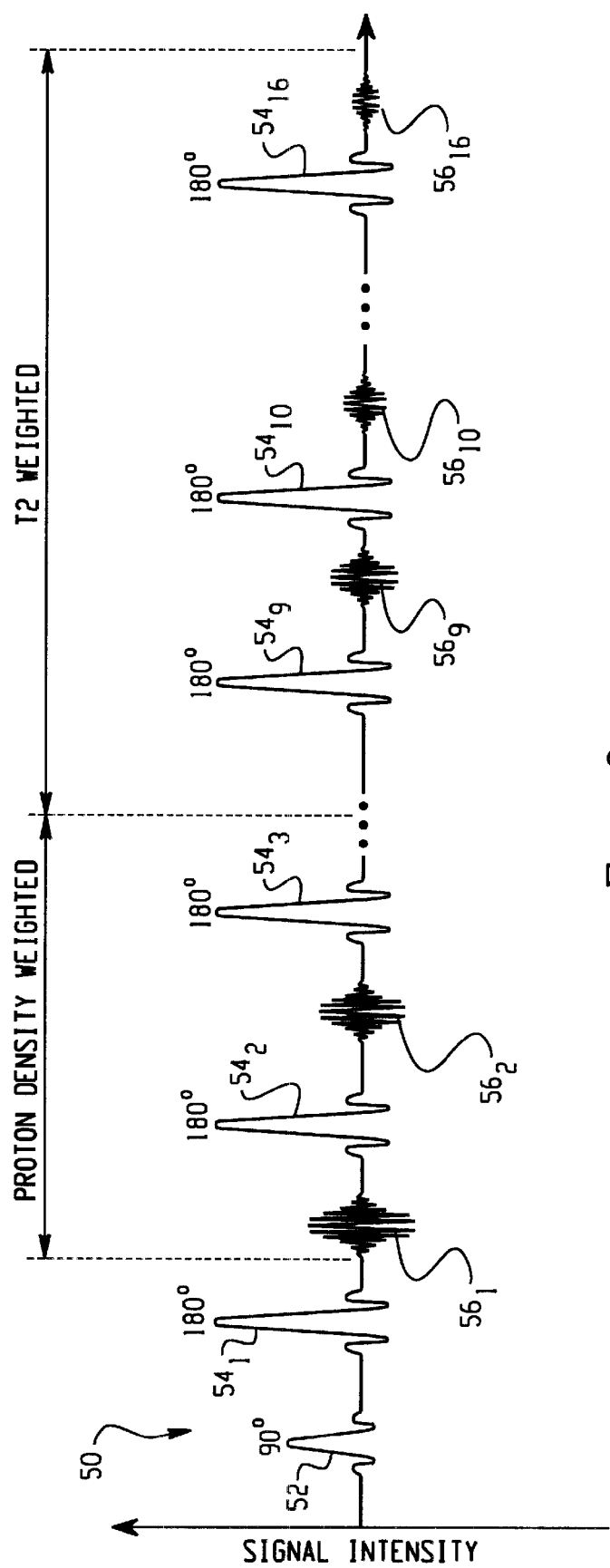
FIG. 2 illustrates one repeat of a preferred fast spin echo imaging sequence in accordance with the present invention.

With reference to FIG. 2 and continuing reference to FIGS. 1A and 1B, a fast spin echo (FSE) imaging sequence 50 commences with a radio frequency excitation pulse 52, typically 90°. Following the RF excitation pulse, a series of 180° refocusing pulses are applied $54_1, 54_2, \ldots, 54_{16}$. The application of each refocusing pulse results in the generation of a magnetic resonance echo $56_1, 56_2, \ldots, 56_{16}$. While not shown in FIG. 2, it is to be appreciated that slice-select gradient pulses, phase-encoding gradient pulses, read gradient pulses, and the like are also applied as is typical in a fast spin echo sequence.

In a preferred embodiment, the FSE has an echo train length (ETL) of sixteen which generates sixteen echoes following each of sixteen 180° refocusing pulses. In the embodiment of FIG. 2, the first half of the ETL, preferably eight echoes, is reconstructed into a proton density weighted image (PDW), while the second half of the ETL, starting with the ninth echo, is reconstructed into a T2 weighted image.

Referring again to FIGS. 1A and 1B, the digital data lines are sorted by a sorter 60 between early echo data lines and late echo data lines. It will be appreciated that the first echo is the most heavily proton-density weighted or T1 weighted, while the last echo is the most heavily T2 weighted. The sorted radio frequency signals are stored into an early echo memory 70 and a late echo memory 74. Optionally, echoes near the mid-point of the sequence can be channeled to both memories. The MR data lines are preferably passed through filters 76, 78, such as a Blackman, Hanning, Hamming, or Gaussian filter. A pair of reconstruction processors 80, 82 (or a single time shared processor) reconstruct the data to form an electronic image representation. Reconstruction is preferably accomplished by a two-dimensional Fourier transform or other appropriate reconstruction algorithm. The image may represent a three-dimensional slab, a planar slice through the patient, an array of parallel planar slices, other three-dimensional volumes, or the like. The image representations are stored in image memories 84, 86.

At this point in the imaging process, both a proton density weighted (PDW) image and a T2 weighted (T2W) volume image representation are stored in the image memories 84, 86. Proton density weighted images typically provide better background and tissue depiction; while T2 weighted images typically provide better vessel depiction for a black blood technique.

Figure 3:
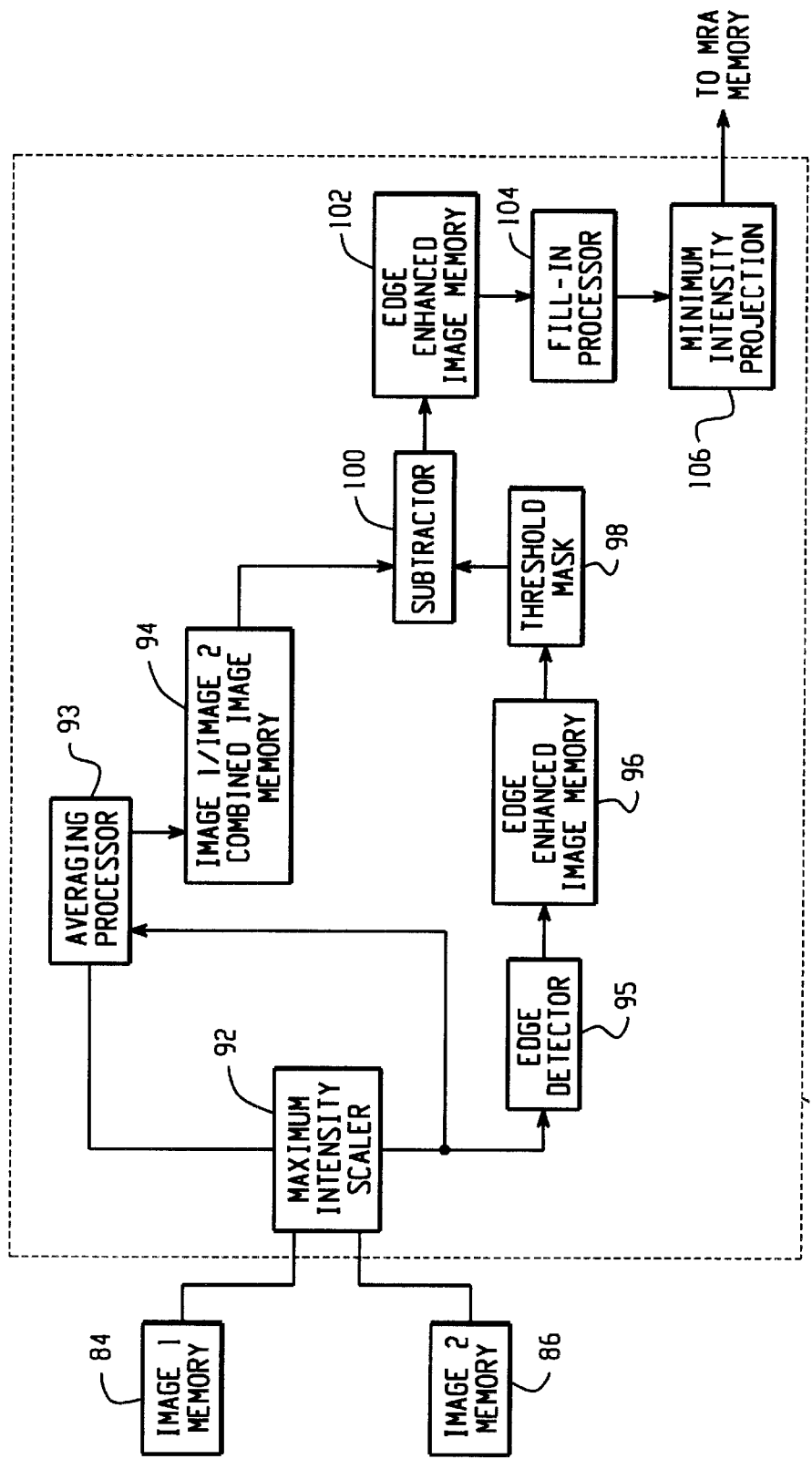
FIG. 3 illustrates a diagrammatic illustration of a combination processor in accordance with the present invention.

These two image representations are combined in image space by a combination processor 90. The PDW image and T2W image can be combined using a variety of methods, such as thresholding, addition, and multiplication of the images. With reference to FIG. 3 and continuing reference to FIGS. 1A and 1B, in one preferred embodiment, the combination processor 90 scales 92 the PDW and T2W images to the same maximum intensity level. In other words, the brightest point on the PDW image has the same intensity as the brightest point on the T2W image. From here, the T2W image signal is split. One branch of the T2W image signal is averaged together with the PDW image to make the background more homogeneous, preferably via a complex averaging processor 93, to form an averaged or combined image which is stored in a PDW and T2W combined image memory 94. It is to be appreciated that the complex averaging provides an enhanced signal-to-noise ratio (SNR). The other branch of the T2W image signal is processed by an edge detector or edge enhancement processor 95 in order to extract vessel edges, yielding an edge or gradient image which is stored in an edge image memory 96. Preferably, the gradient image 96, G, is produced by calculating the maximum directional derivative, i.e. second derivative, image from the T2W image and taking its absolute value within a 3×3 grid. In mathematical terms, the gradient is calculated as follows:

$$D_x = I(i+1,j) - I(i-1,j) \quad (1)$$

$$D_y = I(i,j+1) - I(i,j-1) \quad (2)$$

From this, a maximum gradient, G, is calculated:

$$G = \frac{D_X^2 + D_Y^2}{\sqrt{D_X^2 + D_Y^2}} = \sqrt{D_X^2 + D_Y^2}. \quad (3)$$

In an alternate embodiment of the invention, a higher resolution derivative image is calculated by performing a 2-D Fourier transform of the T2W image, multiplying by $j\omega_x$ and $j\omega_y$, and reverse transforming. A threshold mask 98 is optionally applied to the maximum gradient, G, in order to removed any falsified gradient due to the noise level. The threshold is determined by:

$$I_{threshold} = \sqrt{2}(\bar{I}_{noise} + \sigma_{noise}) \quad (4).$$

This results in an image that is maximum black along the blood flow edges (typically about 2–4 pixels wide) and white everywhere else, including the center of the blood flow. Of course, black and white can be reversed.

The final combined black blood angiography image or edge enhanced image, $I_{BB}$, is generated by combining the edge image and the averaged or combined image, preferably by subtracting the edge image from the averaged image, using a processor 100, preferably a subtractor.

Mathematically, $I_{BB}$ is given by:

$$I_{BB} = |(S_{PDW} + S_{T2W})| - G_{max}(|S_{T2W}|) \quad (5).$$

Subtraction of the edge image from the average image is performed using amplitude images so there are no phase problems between the edge image and the averaged image. Those skilled in the art will appreciate that imaging difficulty may arise with blood vessels which circulate blood in directions perpendicular to the imaging plane. It is to be appreciated that subtracting the edge image from the average image drives the edges of the vessels black for 2–4 pixels in the combined image. Therefore, the vessels of most interest in angiography examinations, i.e., vessels having diameters on the order of 5–6 pixels wide, appear black. Larger diameter vessels which cross the imaging plane, i.e., vessels having diameters of 10–15 pixels wide, may appear as a black annular ring with a light center. The edge enhanced or combined image is stored in an edge enhanced image memory 102. Optionally, the centers of the annular rings are filled in black by a fill-in processor 104 using a number of conventional techniques such as minimum intensity projection, region growing, and the like.

After calculation of the combined black blood image, a conventional minimum intensity projection algorithm 106 is optionally applied to the combined black blood image in order to enhance signal voids representative of blood vessels. It is to be appreciated that the above image combining technique is applicable to a variety of other imaging applications, such as processing 2-D and 3-D data, processing field and/or spin echoes, processing two or more source images, combining black-blood and white-blood MRA images to form an arteriogram and venogram, and the like. Further, the preferred image combining technique may be used to combine various complex image representations which have different preferential attributes in order to produce an enhanced combination image.

In another embodiment of the combination process, the black blood portions of the T2 images are combined with the tissue image portions of the PDW images. More particularly, the T2W images are thresholded to identify voxels that are sufficiently black/dark gray that they indicate blood. Voxels blacker than the threshold are taken from the T2W image representation and voxels whiter than the threshold are taken from the PDW image representation.

Regardless of the combination process employed, the combination of the PDW image and T2W image result in the generation of a black blood angiograph which is stored in an MRA memory 110. A video processor 112 under operator control selects data from any or all of the PDW image memory 84, the T2W image memory 86 and the MRA image memory 110. In one preferred mode, the video processor selects corresponding slices from all three image memories for concurrent, side-by-side display on a monitor 114 to provide a human-readable display.

It is to be appreciated that the combination process of the preferred embodiment may be employed to combine any two or more complex image representations, where each complex image representation has different preferential attributes. For example, multiple complex PDW, T2W, and T1W image representations, each complex image representation containing supplementary and complementary information, may be combined by the preferred combination method.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. A method for generating a black blood magnetic resonance angiograph of a body portion, said method comprising:
   (a) exciting dipoles within a selected imaging region to produce magnetic resonance signals;
   (b) inducing a train of magnetic resonance echoes after the excitation, early echoes of the train being more heavily proton density weighted and later echoes being more heavily T2 weighted;
   (c) phase and frequency encoding the train of magnetic resonance echoes;
   (d) receiving and demodulating the train of magnetic resonance echoes into a series of data lines;
   (e) sorting the data lines between data lines from more heavily proton density weighted echoes and data lines from more heavily T2 weighted echoes;
   (f) reconstructing the more heavily proton density weighted data lines into a proton density weighted image representation and the more heavily T2 weighted data lines into a T2 weighted image representation; and
   (g) combining the proton density weighted image representation and the T2 weighted image representation to generate a combined image representation.

2. The method as set forth in claim 1, further including:
   computing a blood vessel edge enhanced image representation; and combining the proton density and edge enhanced image representations to generate a vessel edge enhanced angiographic image representation.

3. A method for generating a black blood magnetic resonance angiograph of a body portion, said method comprising:
   (a) exciting dipoles within a selected imaging region to produce magnetic resonance signals;
   (b) inducing a train of magnetic resonance echoes after the excitation, early echoes of the train being more heavily proton density weighted and later echoes being more heavily T2 weighted;
   (c) phase and frequency encoding the train of magnetic resonance echoes;
   (d) receiving and demodulating the train of magnetic resonance echoes into a series of data lines;
   (e) sorting the data lines between data lines from more heavily proton density weighted echoes and data lines from more heavily T2 weighted echoes;
   (f) reconstructing the more heavily proton density weighted data lines into a proton density weighted image representation and the more heavily T2 weighted data lines into a T2 weighted image representation;
   (g) scaling the proton density weighted image representation and the T2 weighted image representation to a common maximum intensity level;
   (h) combining the proton density weighted image representation and the T2 weighted image representation to generate a combined image representation;
   (i) computing an edge enhanced image from the T2 weighted image representation; and
   (j) combining the edge enhanced image and the combined image representations to form an angiographic image representation.

4. The method as set forth in claim 3, said method further comprising:
   performing a minimum intensity projection enhancement on the angiographic image representation.

5. The method as set forth in claim 3, wherein computing the edge image includes:
   calculating a maximum directional derivative image representation based on the T2 weighted image representation; and
   filtering each pixel value of the derivative image grid of surrounding pixel values.

6. The method as set forth in claim 3, further including:
   converting the angiographic image representation into a human-readable display.

7. The method as set forth in claim 3, further including:
   selecting corresponding portions of the proton density weighted image representation, the T2 weighted image representation, and the angiographic image representation; and,
   converting the selected image representation portions into a concurrent, side-by-side human-readable display of the selected portions.

8. The method as set forth in claim 3, wherein the step of inducing a train of magnetic resonance echoes includes:
   inverting magnetic resonance in the excited dipoles into a first echo;

after the first echo, inverting the resonance to induce a second echo; and, following each of the second and subsequent echoes inverting the resonance to induce additional echoes.

9. The method as set forth in claim 3, wherein the steps of exciting dipoles and inducing a train of magnetic resonance echoes includes applying a fast spin echo sequence to generate N echoes, where N is an integer.

10. A method for generating a black blood magnetic resonance angiograph of a body portion, said method comprising:

(a) exciting dipoles within a selected imaging region to produce magnetic resonance signals;

(b) inducing a train of magnetic resonance echoes after the excitation, early echoes of the train being more heavily proton density weighted and later echoes being more heavily T2 weighted;

(c) phase and frequency encoding the train of magnetic resonance echoes;

(d) receiving and demodulating the train of magnetic resonance echoes as a series of data lines;

(e) sorting the data lines between data lines from more heavily proton density weighted echoes and data lines from more heavily T2 weighted echoes;

(f) reconstructing the more heavily proton density weighted data lines into a proton density weighted image representation and the more heavily T2 weighted data lines into a T2 weighted image representation;

(g) scaling the proton density weighted image representation and the T2 weighted image representation to a common maximum intensity level;

(h) averaging the proton density and T2 weighted image representations, forming an averaged image representation;

(i) computing an edge image from the T2 weighted image representation; and (j) subtracting the edge image from the averaged image representation, forming an angiographic image representation.

11. The method as set forth in claim 10, said method further comprising:

performing a minimum intensity projection enhancement on the angiographic image representation.

12. The method as set forth in claim 10, wherein computing the edge image includes:

calculating a maximum directional derivative image representation based on the T2 weighted image representation; and filtering each pixel value of the derivative image representation of surrounding pixel values.

13. A magnetic resonance imaging system which includes a magnet for generating a temporally constant magnetic field through an examination region, a radio frequency transmitter for exciting and inverting magnetic dipoles in the examination region to generate a train of magnetic resonance echoes, and gradient magnetic field coils and a gradient magnetic field controller for generating at least phase and read magnetic field gradient pulses in orthogonal directions across the examination region, a receiver for receiving and demodulating the magnetic resonance echoes to produce a series of data lines, the system further comprising:

a sort processor for sorting data lines between proton density weighted data lines and T2 weighted data lines;

an early echo volume memory for storing the proton density weighted data lines;

a late echo volume memory for storing the T2 weighted data lines;

an image processor for reconstructing the proton density weighted data lines into a proton density weighted image representation and the T2 weighted data lines into a T2 weighted image representation; and a combination processor for combining the proton density weighted and the T2 weighted image representations.

14. The magnetic resonance imaging system according to claim 13, wherein the combination processor includes:

a scaling processor which scales the proton density weighted and T2 weighted image representations to a common maximum intensity level;

an averaging processor which averages the proton density weighted and T2 weighted image representations into an averaged image representation;

an edge image processor which computes an edge image representation from the T2 weighted image representation; and a subtractor which subtracts the edge image representation from the averaged image representation to from an edge enhanced image representation.

15. The magnetic resonance imaging system according to claim 14, wherein the edge image processor calculates a second derivative image based on the T2 weighted image representation.

16. The magnetic resonance imaging system according to claim 13, wherein the system includes:

a video processor and monitor which provide a concurrent, human-readable display of at least two of the proton weighted image representation, the T2 weighted image representation, and a black blood angiogram.

17. A magnetic resonance imaging system comprising:

a magnet for generating a temporally constant magnetic field through an examination region;

a radio frequency transmitter for exciting and manipulating magnetic dipoles in the examination region to generate a train of magnetic resonance echoes;

a receiver for receiving and demodulating the magnetic resonance echoes to produce a series of data lines, the early echo data lines being more heavily proton density weighted and the late echo data lines being more T2 weighted;

an image processor for reconstructing the early echo data lines into a proton density weighted image representation and the late echo data lines into a T2 weighted image representation; and a combination processor for combining the proton density weighted and the T2 weighted image representations, said combination processor including:

a scaling processor which scales the proton density weighted and T2 weighted image representations to a common maximum intensity level;

a processor which combines the proton density weighted and T2 weighted image representations into a combined image representation;

an edge image processor which computes an edge image representation from the T2 weighted image representation; and a processor which combines the edge image representation and the combined image representation to form an edge enhanced angiographic image representation.

18. The magnetic resonance imaging system according to claim 17, wherein the edge image processor calculates a second derivative image based on the T2 weighted image representation.

19. A magnetic resonance imaging system comprising:

a means for generating a temporally constant magnetic field through an examination region;

a means for exciting and inverting magnetic dipoles in the examination region to generate a train of magnetic resonance echoes, early echoes being more heavily proton density weighted and late echoes being more heavily T2 weighted;

a means for receiving and demodulating the magnetic resonance echoes to produce a series of data lines;

a means for reconstructing the early echo data lines into a proton density weighted image representation and late echo data lines into a T2 weighted image representation;

a means for combining the proton density weighted image representation with the T2 weighted image representation;

an edge enhancement means for generating an edge enhanced image representation from the T2 weighted image representation; and a means for combining the combined proton density weighted and T2 weighted image representations to generate an edge enhanced angiographic image representation.

20. A method for combining at least a first and a second complex image representation, said image representations having different preferential attributes, said method including:

(a) scaling the first and second complex image representations to a common maximum intensity level;

(b) combining the first and second complex image representations together to form a combined image;

(c) calculating a gradient image by differentiating at least one of the first and second complex image representations in order to enhance desired image features present in the at least one of the first and second image representations; and (d) combining the gradient image with the combined image to form a desired feature enhanced image having enhanced supplementary and redundant information relative to the first and second complex image representations.

21. The method as set forth in claim 20, wherein combining the first and second complex image representations includes:

averaging the first and second complex image representations, forming an averaged image.

22. The method as set forth in claim 21, wherein combining the gradient image with the combined image includes:

subtracting the gradient image from the combined image to form a desired feature enhanced image.

23. The method as set forth in claim 20, the method further including:

processing the feature enhanced image using at least one of a minimum and a maximum projection algorithm.

24. A method for combining at least a first complex image representation and a second complex image representation, said image representations having different preferential attributes, said method including:

(a) intensity scaling and combining the first and second complex image representations together to form a combined image;

(b) calculating a gradient image by differentiating at least one of the first and second complex image representations in order to enhance desired image features present in the at least one of the first and second image representations, said calculating step including:

calculating a maximum directional derivative image; and filtering pixel values of the maximum directional derivative image with a grid of surrounding pixels; and (c) combining the gradient image with the combined image to form a desired feature enhanced image.

25. A method for combining at least first and second complex image representations, said image representations having different preferential attributes, said method including:

(a) scaling the first and second complex image representations to a common maximum intensity level;

(b) combining the first and second complex image representations together to form a combined image;

(c) calculating a gradient image by differentiating at least one of the first and second complex image representations;

(d) applying a threshold mask to the gradient image to filter distortions in the gradient image caused by noise; and (e) combining the threshold mask filtered gradient image with the combined image to form a desired feature enhanced image having enhanced supplementary and redundant information relative to the first and second complex image representations.

* * * * *